US009077357B2

(12) United States Patent
Kon et al.

(10) Patent No.: US 9,077,357 B2
(45) Date of Patent: Jul. 7, 2015

(54) SEMICONDUCTOR DEVICE AND ELECTRONIC CONTROL DEVICE

(71) Applicant: Renesas Electronics Corporation, Kanagawa (JP)

(72) Inventors: Masumi Kon, Kanagawa (JP); Jou Kudou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/507,265

(22) Filed: Oct. 6, 2014

(65) Prior Publication Data
US 2015/0109155 A1 Apr. 23, 2015

(30) Foreign Application Priority Data

Oct. 18, 2013 (JP) .................. 2013-217508

(51) Int. Cl.
*H03M 1/06* (2006.01)
*H03M 1/10* (2006.01)

(52) U.S. Cl.
CPC .......... *H03M 1/0607* (2013.01); *H03M 1/1019* (2013.01)

(58) Field of Classification Search
CPC ........ H03M 1/00; H03M 1/12; H03M 1/1023
USPC ........................................ 341/167
See application file for complete search history.

(56) References Cited

U.S. PATENT DOCUMENTS 4,620,178 A * 10/1986 Naito ............................ 341/167
4,771,265 A * 9/1988 Okui et al. ................... 341/167
5,229,771 A 7/1993 Hanlon

FOREIGN PATENT DOCUMENTS

DE 4405380 A1 8/1995
EP 0256324 A1 2/1988
GB 1596498 A 8/1981
JP 2012-039273 A 2/2012

OTHER PUBLICATIONS

Kumar V J et al: "Digital Converter for Push-Pull Type Resistive Transducers", Horological Journal, Ashford, GB, No. 7, May 16, 2005, pp. 422-425, XP001508997, ISSN: 0018-5108.
Mohan N M et al: "A Novel Dual-Slope Resistance-to-Digital Converter", IEEE Transactions on Instrumentation and Measurement, IEEE Service Center, Piscataway, NJ, US, vol. 59, No. 5, Apr. 7, 2010, pp. 1013-1018, XP011299338, ISSN: 0018-9456.
Behzad Razavi: "Introduction to Switched-Capacitor Circuits", Apr. 2, 2007, pp. 395-438, XP55179761, [retrieved on Mar. 27, 2015].
Communication dated Apr. 7, 2015 from the European Patent Office in counterpart European Application No. 14188457.7.

* cited by examiner

*Primary Examiner* — Jean B Jeanglaude
(74) *Attorney, Agent, or Firm* — Sughrue Mion, PLLC

(57) ABSTRACT

To suppress detection accuracy of a measurement resistance from decreasing by an on-resistance of a selector switch. The selector switch is provided between a first node coupled to a first voltage through a reference resistance and multiple second nodes coupled to the second voltage through measurement resistances, and selects the second node to be coupled to the first node with the selector switch. A correction circuit generates a voltage obtained by adding the second voltage to a voltage between the second node and the first node as a correction voltage. A double integral ADC finds a first integral time elapsed when a difference voltage of the correction voltage to a voltage of the first node is integrated to the first voltage and a second integral time elapsed when the difference voltage of the first voltage to the voltage of the first node is integrated to the correction voltage.

18 Claims, 11 Drawing Sheets

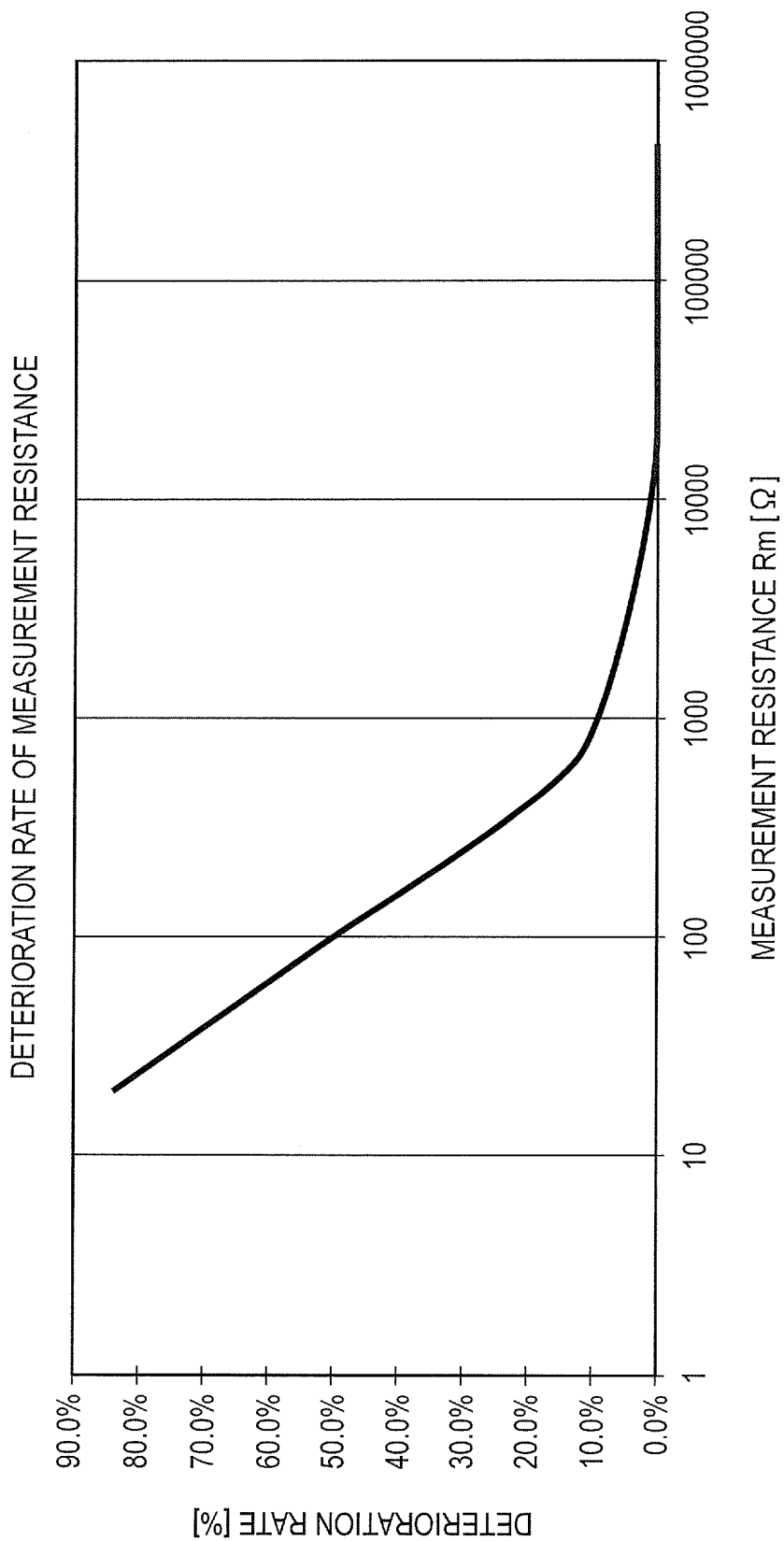

SEMICONDUCTOR DEVICE AND ELECTRONIC CONTROL DEVICE

CROSS-REFERENCE TO RELATED APPLICATIONS

The disclosure of Japanese Patent Application No. 2013-217508 filed on Oct. 18, 2013 including the specification, drawings and abstract is incorporated herein by reference in its entirety.

BACKGROUND

The present invention relates to a semiconductor device having a double integral analog-digital conversion circuit, and furthermore, an electronic control device using the analog-digital conversion circuit, and relates to a technology effective when being applied to an electronic control device for controlling an apparatus such as a power train while monitoring a resistance in a measurement sensor, for example, in an in-vehicle system.

In order to monitor a resistance of a measurement sensor, the double integral analog-digital conversion circuit can be used from its feature of being capable of high precision conversion in a simple circuit. As a representative of the double integral analog-digital conversion circuit, for example, as described in Japanese Unexamined Patent Application Publication No. 2012-39273, there is a circuit for finding a digital output by integrating an input voltage and a reference voltage whose polarity is opposite to the value two times in succession with a Miller integrating circuit. For example, an input voltage Vin can be found by counting a time elapsed when a voltage of an integrator varies from an output voltage V0 obtained by integrating the input voltage Vin for a specified time to a voltage of 0 V obtained by integrating the reference voltage Vref. When assuming the double integral analog-digital conversion circuit of FIG. 9, a conversion operation is performed by integrating the analog input voltage Vin with an integrator with and subsequently integrating the reference voltage Vref with the integrator again. V1 during a period when the analog input voltage Vin is integrated by the Miller integrating circuit becomes as shown by Formula 1. Incidentally, parameters in the following Formula 1 to Formula 3 are as follows. V1: output voltage Vo of the integrator at the time of integrating the input voltage Vin; V2: output voltage Vo of the integrator at the time of integrating the reference voltage Vref; t1: the specified time; N2: pulse count at time t1; t2: integral time of the reference voltage Vref; and n: pulse count at time t2 (digital output).

[Formula 1]

$$V_1 = -\frac{Vin}{RC}t_1 = \frac{Vin}{RC}NT \quad (1)$$

V2 during a period when the reference voltage Vref is integrated by the integrator becomes as shown by Formula 2.

[Formula 2]

$$V_2 = V_1 - \frac{1}{RC}(-Vref)t_2 = V_1 - \frac{1}{RC}(-Vref)nT \quad (2)$$

In Formula 2, it shall be integrated until V2 becomes V2=0 and a relationship of Formula 3 is obtained by substituting Formula 1 into this.

[Formula 3]

$$n = \frac{Vin}{Vref} \cdot N \quad (3)$$

As is clear from Formula 3, the input voltage Vin is converted into the pulse count (digital output) of n.

For example, when intending to monitor a resistance of a thermistor of a temperature sensor, a reference resistance can be coupled in series to the thermistor serving as the measurement resistance and its divided voltage can be used as the input voltage. If the reference resistance Rpu and the measurement resistance Rm are coupled in series between the reference voltages Vp, Vn and a voltage of their binding node is used as the input voltage Vin, the measurement resistance Rm can be found by Formula 4.

[Formula 4]

$$Rm = \frac{Vn - Vin}{Vin - Vp} \cdot Rpu \quad (4)$$

SUMMARY

In order to measure multiple measurement resistances by achieving commonality of the double integral analog-digital conversion circuit among them, for example, as illustrated in FIG. 10, multiple measurement resistances can be monitored by providing multiple measurement resistances Rm to a common reference resistance Rpu and coupling the measurement resistance selected by a multiplexer to the reference resistance in series.

However, the switching device of the multiplexer has not a little on-resistance Ron. By such an on-resistance being added to the measurement resistance Rm, an input voltage Vin that is different from assumption will be inputted into the double integral analog-digital conversion circuit, which will cause a problem that measurement accuracy of the measurement resistance Rm becomes deteriorated. Since the above-mentioned on-resistance has a temperature dependence and is affected by manufacture variation, it is not easy to grasp the value correctly.

A formula for finding the measurement resistance Rm from a configuration of FIG. 10 that takes the on-resistance into consideration becomes Formula 5.

[Formula 5]

$$Rm = \frac{Vn - Vin}{Vin - Vp} \cdot Rpu - Ron \quad (5)$$

As is clear from Formula 5, even if the input voltage can be found by the double integral analog-digital conversion circuit, it is impossible to find a correct resistance value of the measurement resistance Rm because a value of the on-resistance Ron of the switch of Formula 5 is unknown. If the measurement resistance Rm is measured without taking the on-resistance Ron of the switch into consideration, no consideration of the on-resistance of the switch, as it is, will lead to deterioration of the measurement accuracy. When paying attention to a configuration of the double integral analog-digital conversion circuit of FIG. 9, unconformity that the on-resistance of the switch in the input circuit of FIG. 10 affects only charging of the input voltage Vin in double integral and does not affect charging of the reference voltage lowers detection accuracy of the measurement resistance.

The above-mentioned and other problems and new features will become clear from the following description and the accompanying drawings of this specification.

Explaining briefly a representative embodiment among embodiments that are disclosed in this application, it will be as described below.

That is, selector switches are provided between a first node coupled to a first voltage through the reference resistance and multiple second nodes coupled to a second voltage through measurement resistances, and the second node to be coupled to the first node is selected by the selector switches. A correction circuit that generates a voltage obtained by adding the second voltage to a voltage between the second node selected by the selector switches and the first node as a correction voltage is provided. The double integral analog-digital conversion circuit finds a first integral time elapsed when a difference voltage of the correction voltage with respect to a voltage of the first node is integrated to the first voltage and a second integral time elapsed when a difference voltage of the first voltage with respect to the voltage of the first node is integrated to the correction voltage.

Explaining briefly an effect that can be obtained by a representative embodiment among embodiments disclosed in this application, it will be as follows.

That is, since an influence of an on-resistance of the selector switch comes to be consistent between the first integral and the second integral of the double integral, it is possible to suppress the detection accuracy of the measurement resistance from decreasing caused by the on-resistance of the selector switch.

BRIEF DESCRIPTION OF THE DRAWINGS

FIG. 11 is an explanatory diagram for showing that in the case where the resistance value of the measurement resistance is small, the measurement resistance is susceptible to be affected by an on-resistance of a selector switch.

DETAILED DESCRIPTION

1. Outline of Embodiment

Figure 1:
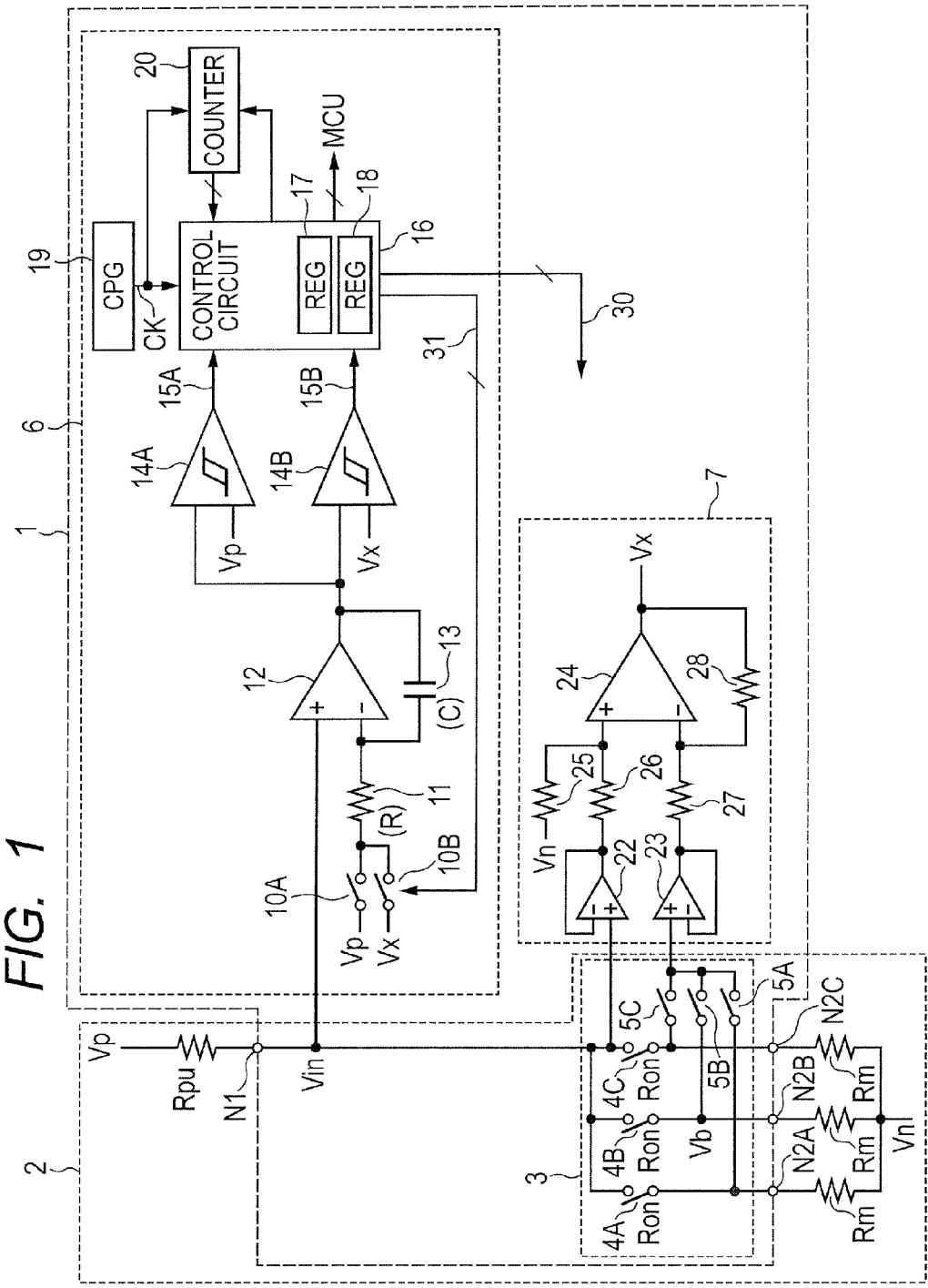
FIG. 1 is a block diagram of a semiconductor device having a double integral analog-digital conversion circuit.

First, an outline about embodiments disclosed in this application will be explained. In the explanation of the outline about the embodiments, any reference numeral in the drawing that is referred to with a parenthesis attached merely illustrates what is included in a concept of a component.

[1] <<FIG. 1, Semiconductor Device>>

A semiconductor device (1) has: a first node (N1) coupled to a first voltage (Vp) through a reference resistance (Rpu); multiple second nodes (N2A, N2B, and N2C) coupled to a second voltage (Vn) through measurement resistances (Rm); multiple selector switches (4A, 4B, and 4C) for selecting the second node to be coupled to the first node; a correction circuit (7) that generates a voltage obtained by adding the second voltage to the voltage between the second node selected by the selector switches and the first node as a correction voltage (Vx); and a double integral analog-digital conversion circuit (6) that finds a first integral time (t1) elapsed when a difference voltage of the correction voltage with respect to the voltage of the first node is integrated to the first voltage and a second integral time (t2) elapsed when a difference voltage of the first voltage with respect to the voltage of the first node is integrated to the correction voltage.

According to this, a voltage (Vin) of the first node is a sum of the second voltage (Vn), a drop voltage (IRm) by the measurement resistance (Rm), and a drop voltage (Iron) by the selector switch. The correction voltage (Vx) is a sum of the second voltage (Vn) and the drop voltage (Iron) by the selector switch. Therefore, an integral time of a first integral operation elapsed when a difference voltage (Vin−Vx=IRm) of the correction voltage (Vx) to the voltage of the first node is integrated to the first voltage does not include a component of an on-resistance of the selector switch. Moreover, since the first voltage is a sum of the second voltage (Vn), the drop voltage (IRm) by the measurement resistance (Rm), the drop voltage (Iron) by the selector switch, and the drop voltage (IRpu) by the reference resistance (Rpu), the integral time of a second integral operation elapsed when a difference voltage (Vin−Vp=−IRpu) of the first voltage to the voltage of the first node is integrated to the correction voltage does not include the component of the on-resistance of the selector switch similarly. Therefore, since an influence of the on-resistance of the selector switch comes to be consistent between the first integral and the second integral of double integral, it is possible to suppress detection accuracy of the measurement resistance from decreasing caused by the on-resistance of the selector switch, which enables the resistance value of the measurement resistance to be measured with high precision.

[2] <<Integrating Circuit, Detection Circuit, and Control Circuit>>

In the clause 1, the double integral analog-digital conversion circuit has: an integrating circuit (12) that performs the first integral operation of integrating the difference voltage of the correction voltage with respect to the first node and the second integral operation of integrating the difference voltage of the first voltage with respect to the voltage of the first node;

detection circuits (14A, 14B, 14) that generate a first detection signal (15A) when an integral output of the integrating circuit reaches the first voltage in the first integral operation and generate a second detection signal (15B) when an integral output of the integrating circuit reaches the correction voltage in the second integral operation; a counter (20) for counting a clock signal (CK); and a control circuit (16) that acquires a first count value (N) by the counter from when the first integral operation is started by the integrating circuit until the first detection signal is generated and a second count value (n) by the counter from when the second integral operation is started thereby until the second detection signal is generated.

According to this, the double integral analog-digital conversion circuit can be comparatively easily formed.

[3] <<Miller Integrating Circuit>>

In the clause 2, the integrating circuit is a Miller integrating circuit (12) that receives the voltage of the first node at its noninverting input terminal and receives selectively the first voltage or the correction voltage at its inverting input terminal.

According to this, the integrating circuit can be comparatively easily formed using an operational amplifier.

[4]<<Correction Circuit by Buffer Amplifier and Differential Amplifier>>

In the clause 1, the correction circuit has: a first buffer amplifier (22) for receiving the voltage of the first node; a second buffer amplifier (23) for receiving a voltage of the second node selected by the selector switches; and a differential amplifier (24) that forms a voltage obtained by adding the second voltage to a difference voltage of the output of the second buffer amplifier with respect to the output of the first buffer amplifier as the correction voltage.

According to this, the correction circuit can be comparatively easily formed using an operational amplifier.

[5]<<Correction Circuit by Switched Capacitor Circuit>>

In the clause 1, the correction circuit has: an operational amplifier (41) that receives the second voltage at its noninverting input terminal and to which one capacitance electrode of the input capacitance is bound at its inverting input terminal; a first switch (42) that makes feedback coupling of an output terminal of the operational amplifier to the inverting input terminal; a feedback capacitance (43) coupled to the first switch in parallel; a second switch (44) that is switch-controlled in phase with the first switch and applies the voltage of the first node to the other capacitance electrode of the input capacitance in the ON state; and a third switch (45) that is switch-controlled in reverse phase with the first switch and applies the voltage of the second nodes to the other capacitance electrode of the input capacitance in the ON state.

According to this, the number of operational amplifiers can be reduced compared with the correction circuit of the clause 4.

[6] <<First Node and Second Nodes are External Terminals>>

In the clause 1, the first node and the second nodes are external terminals.

According to this, necessity for an input into the double integral circuit is reduced to simply a matter of preparing the reference resistance and the measurement resistance as external circuit elements of the semiconductor device.

Figure 6:
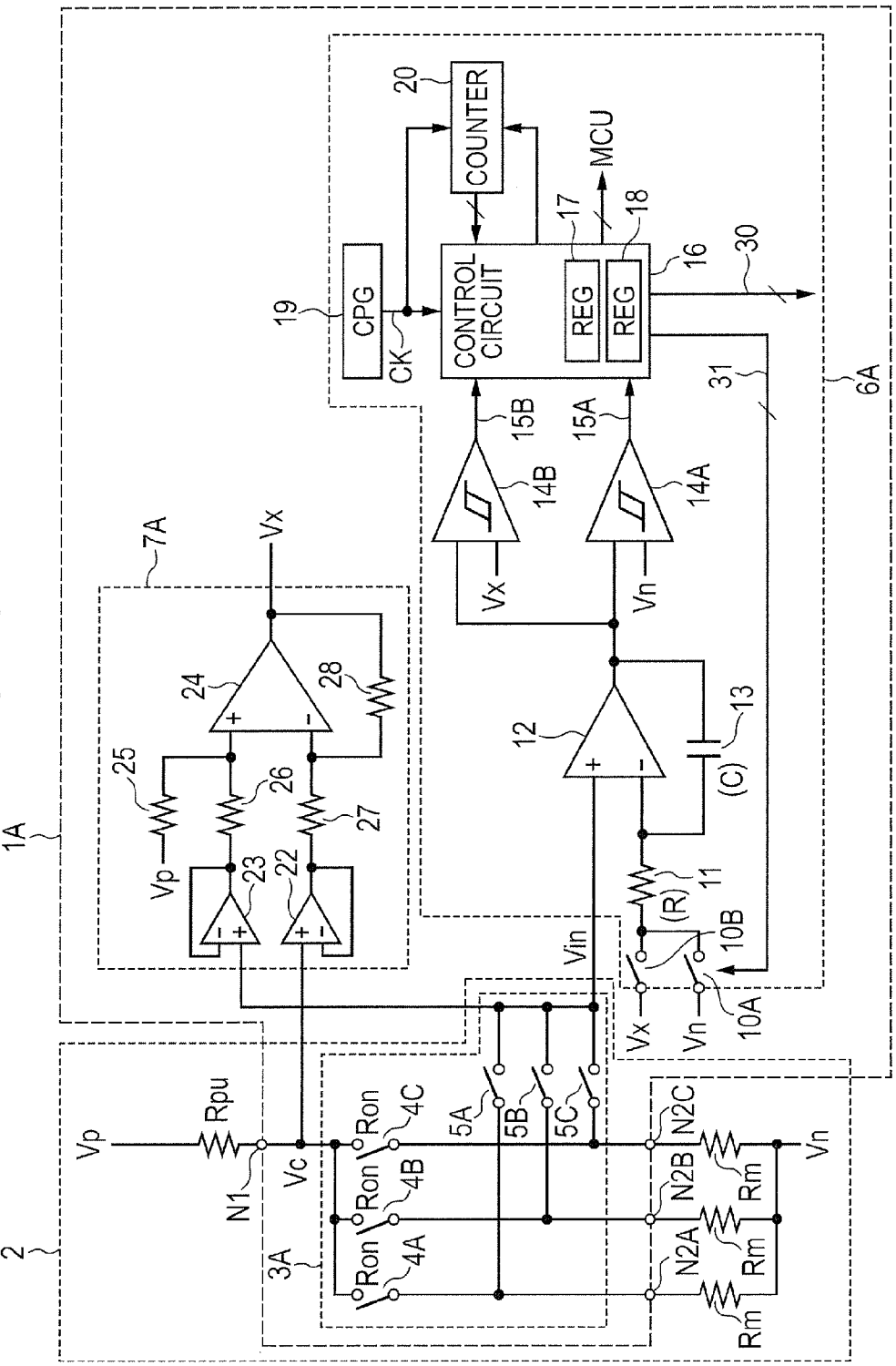
FIG. 6 is a block diagram for showing a second example of the semiconductor device having the double integral analog-digital conversion circuit.

[7] <<FIG. 6, Semiconductor Device>>

A semiconductor device (1A) has: a first node (N1) coupled to a first voltage (Vp) through the reference resistance (Rpu); multiple second nodes (N2A, N2B, and N2C) coupled to the second voltage (Vn) through measurement resistances (Rm); multiple selector switches (4A, 4B, and 4C) for selecting the second node to be coupled to the first node; a correction circuit (7A) that generates a voltage obtained by subtracting the voltage between the second node selected by the selector switches and the first node from the first voltage as the correction voltage (Vx); and a double integral analog-digital conversion circuit (6A) that finds the first integral time (t1) elapsed when the difference voltage of the correction voltage with respect to the voltage of the second nodes is integrated to the second voltage and the second integral time (t2) elapsed when a difference voltage of the second voltage with respect to the voltage of the second nodes is integrated to the correction voltage.

According to this, the voltage (Vin) of the second nodes is a sum (Vin=Vn+IRm) of the second voltage (Vn) and the drop voltage (IRm) by the measurement resistance (Rm). The correction voltage (Vx) is a voltage (Vx=Vp−Iron) obtained by subtracting the drop voltage (Iron) by the selector switch from the first voltage (Vp). Since Vp=Vn+IRm+Iron+IRup holds here, the integral time of the first integral operation elapsed when the difference voltage (Vin−Vx=−IRpu) of the correction voltage (Vx) to the voltage (Vin) of the second nodes is integrated to the first voltage does not include the component of the on-resistance of the selector switch. Moreover, the integral time of the second integral operation when the difference voltage (Vin−Vn=IRm) of the second voltage to the voltage of the second nodes is integrated to the correction voltage does not include the component of the on-resistance of the selector switch similarly. Therefore, since the influence of the on-resistance of the selector switch comes to be consistent between the first integral and the second integral of the double integral, it is possible to suppress the detection accuracy of the measurement resistance from decreasing caused by the on-resistance of the selector switch, which enables the resistance value of the measurement resistance to be measured with high precision.

[8] <<Integrating Circuit, Detection Circuit, and Control Circuit>>

In the clause 7, the double integral analog-digital conversion circuit has: the integrating circuit (12) that performs the first integral operation of integrating the difference voltage of the correction voltage with respect to the voltage of the second nodes and the second integral operation of integrating the difference voltage of the second voltage with respect to the voltage of the second nodes; the detection circuits (14A, 14B) that generate the first detection signal (15A) when the integral output of the integrating circuit reaches the second voltage in the first integral operation and generates the second detection signal (15B) when the output of the integrating circuit reaches the correction voltage in the second integral operation; the counter (20) for counting the clock signal (CK); and the control circuit (16) that acquires the first count value (N) by the counter from when the first integral operation is started by the integrating circuit until the first detection signal is generated and the second count value (n) by the counter from when the second integral operation is started thereby until the second detection signal is generated.

According to this, the double integral analog-digital conversion circuit can be comparatively easily formed.

[9] <<Miller Integrating Circuit>>

In the clause 8, the integrating circuit is the Miller integrating circuit (12) that receives the voltage of the second nodes at its noninverting input terminal and receives selectively the second voltage or the correction voltage at its inverting input terminal.

According to this, the integrating circuit can be comparatively easily formed using an operational amplifier.

[10] <<Correction Circuit by Buffer Amplifier and Differential Amplifier>>

In the clause 7, the correction circuit has: a first buffer amplifier (22) for receiving the voltage of the first node; a second buffer amplifier (23) for receiving the voltage of the second node selected by the selector switches; and a differential amplifier (24) that forms a voltage obtained by subtracting a difference voltage of the output of the second buffer amplifier with respect to the output of the first buffer amplifier from the first voltage as the correction voltage.

According to this, the correction circuit can be comparatively easily formed using an operational amplifier.

[11] <<Correction Circuit by Switched Capacitor Circuit>>

In the clause 7, the correction circuit includes: the operational amplifier (41) that receives the first voltage at its non-inverting input terminal and to which one capacitance electrode of the input capacitance is bound at its inverting input terminal; the first switch (42) that makes feedback coupling of the output terminal of the operational amplifier to the inverting input terminal; the feedback capacitance (43) that is coupled to the first switch in parallel; the second switch (44) that is switch-controlled in phase with the first switch and applies the voltage of the first node to the other capacitance electrode of the input capacitance in the ON state; and the third switch (45) that is switch-controlled in reverse phase with the first switch and applies the voltage of the second nodes to the other capacitance electrode of the input capacitance in the ON state.

According to this, the number of operational amplifiers can be reduced compared with the correction circuit of the clause 4.

[12] <<First Node and Second Nodes are External Terminals>>

In the clause 7, the first node and the second nodes are external terminals.

According to this, necessity for an input into the double integral circuit is reduced to simply a matter of preparing the reference resistance and the measurement resistance as external circuit elements of the semiconductor device.

[13] <<Electronic Control Device Adopting Configuration of FIG. 1>>

An electronic control device (60) has: multiple measurement resistances provided in a control object apparatus (63); the reference resistance; the first node coupled to the first voltage through the reference resistance; the multiple second nodes coupled to the second voltage through the measurement resistances; the multiple selector switches for selecting the second node to be coupled to the first node; a correction circuit (7) that generates a voltage obtained by adding the second voltage to the voltage between the second node selected by the selector switches and the first node as the correction voltage; the double integral analog-digital conversion circuit (6) that finds the first integral time elapsed when the difference voltage of the correction voltage with respect to the voltage of the first node is integrated to the first voltage and the second integral time elapsed when the difference voltage of the first voltage with respect to the voltage of the first node is integrated to the correction voltage; and a control part that is for inputting therein the first integral time and the second integral time, calculating a value obtained by multiplying a ratio of the first integral time to the second integral time by a resistance value of the reference resistance as the resistance value of the measurement resistance, and controlling the control object apparatus based on the calculation result.

According to this, like the clause 1, since the influence of the on-resistance of the selector switch comes to be consistent between the first integral and the second integral of the double integral, it is possible to suppress the detection accuracy of the measurement resistance from decreasing caused by the on-resistance of the selector switch, which enables the resistance value of the measurement resistance to be measured with high precision. Therefore, reliability of the control for the control object apparatus can be increased.

[14] <<Thermistor>>

In the clause 13, the measurement resistance is a thermistor used for thermometry.

According to this, the reliability of the control for the control object apparatus based on a measurement result of temperature can be increased.

[15] <<Engine Control>>

In the clause 14, the control object apparatus is an automobile engine.

According to this, the reliability of the control for the automobile engine based on the measurement result of temperature can be increased.

[16] <<Photoconductive Cell>>

In the clause 13, the measurement resistance is a photoconductive cell used for photodetection.

According to this, the reliability of the control for the control object apparatus based on a measurement result of light can be increased.

[17] <<Gas Concentration Measurement>>

In the clause 13, the measurement resistance is a resistance element used for gas concentration measurement.

According to this, the reliability of the control for the control object apparatus based on the measurement result of gas concentration can be increased.

[18] <<Electronic Control Device Adopting Configuration of FIG. 6>>

The electronic control device (60) has: multiple measurement resistances provided in the control object apparatus (63); the reference resistance; the first node coupled to the first voltage through the reference resistance; the multiple second nodes coupled to the second voltage through the measurement resistances; the multiple selector switches for selecting the second node to be coupled to the first node; the correction circuit (7A) that generates a voltage obtained by subtracting the voltage between the second node selected by the selector switches and the first node from the first voltage as the correction voltage; the double integral analog-digital conversion circuit (6A) that finds the first integral time elapsed when the difference voltage of the correction voltage with respect to the voltage of the second nodes is integrated to the second voltage and the second integral time elapsed when the difference voltage of the second voltage with respect to the voltage of the second nodes is integrated to the correction voltage; and a control part for inputting therein the first integral time and the second integral time, calculating a value obtained by multiplying a ratio of the first integral time to the second integral time by the resistance value of the reference resistance as a resistance value of the measurement resistance, and controlling the control object apparatus based on the calculation result.

According to this, like the clause 7, since the influence of the on-resistance of the selector switch comes to be consistent between the first integral and the second integral of the double integral, it is possible to suppress the detection accuracy of the measurement resistance from decreasing caused by the on-resistance of the selector switch, which enables the resistance value of the measurement resistance to be measured with high precision. Therefore, the reliability of the control for the control object apparatus can be increased.

2. Details of Embodiments

Embodiments will be explained further in detail.

<<First Embodiment of Semiconductor Device>>

FIG. 1 shows one example of a semiconductor device having a double integral analog-digital conversion circuit. Although the semiconductor device shown in the figure is especially not limited, it is formed over one semiconductor substrate such as of single crystal silicon with a known CMOS integrated circuit manufacturing technology.

A semiconductor device 1 shown in FIG. 1 forms, for example, a temperature sensor with the reference resistance Rpu and multiple (e.g., three) measurement resistances Rm attached externally. It is not required that the measurement resistances Rm shall be the same.

Since a part of an input circuit 2 is comprised of the semiconductor device 1 through the above-mentioned reference resistance Rpu and multiple measurement resistances Rm, the semiconductor device 1 has a first node N1 coupled to a first voltage Vp through the reference resistance Rpu, the multiple second nodes N2A, N2B, and N2C coupled to a second voltage Vn through the respective measurement resistances Rm, and the multiple selector switches 4A, 4B, and 4C for selecting the second node N2A, N2B, or N2C to be coupled to the first node. An on-resistance of the selector switches 4A, 4B, and 4C is designated as Ron. A current path extending from the first voltage Vp to the second voltage Vn is formed by any one of the selector switches 4A, 4B, and 4C being turned on, and a voltage of the first node N1 and a voltage of the second nodes N2$i$ (i=A, B, and C) that are formed by resistance voltage division are shown in the figure as Vin and Vb, respectively. Selective switches 5A, 5B, and 5C for inputting a voltage of the selected selector switch 4A, 4B, or 4C on the side of the second node N2A, N2B, or N2C in response to an on-operation of the selector switch 4A, 4B, or 4C are arranged. A detection channel switching circuit 3 is comprised of the selector switches 4A, 4B, and 4C and the selective switches 5A, 5B, and 5C. Although being especially not limited, switch control of the detection channel switching circuit 3 is performed by a control signal 30 outputted from a control circuit 16, or is performed by another logic circuit whose illustration is omitted. Incidentally, the first voltage Vp and the second voltage Vn may be voltages generated by a power supply circuit of the semiconductor device 1, or may be voltages given from the outside of the semiconductor device 1.

The semiconductor device 1 has a double integral analog-digital conversion circuit (also described as double integral ADC) 6 and a correction circuit 7.

The correction circuit 7 generates a voltage obtained by adding the second voltage Vn to a voltage between the second node N2A, N2B, or N2C selected by selector switches 4A, 4B, and 4C and the first node N1 as a correction voltage Vx. For example, in FIG. 1, the correction circuit 7 has: a first buffer amplifier 22 that receives a voltage Vin of the first node N1; a second buffer amplifier 23 that receives a voltage Vb of the second node N2A, N2B, or N2C selected by the selector switches 4A, 4B, and 4C through the selective switch 5A, 5B, or 5C; and a differential amplifier 24 that forms a voltage obtained by adding the second voltage Vn to a difference voltage of an output of the second buffer amplifier 23 with respect to an output of the first buffer amplifier 22 as the correction voltage Vx. Resistances 25, 26, 27, and 28 are for gain adjustment.

A double integral ADC 6 finds a first integral time t1 elapsed when a difference voltage of the correction voltage Vx with respect to the voltage Vin of the first node N1 is integrated to the first voltage Vp and a second integral time t2 elapsed when a difference voltage of the first voltage Vp with respect to the voltage Vin of the first node N1 is integrated to the correction voltage Vx. Further in detail, the double integral ADC 6 has, in its first stage, a Miller integrating circuit 12 that receives the voltage Vin of the first node N1 at its noninverting input terminal (+) and receives the first voltage Vp or the correction voltage Vx selected by switches 10A, 10B at its inverting input terminal (−). 13 is an integral capacity (C) and 11 is an integral resistor (R). Selection of the switches 10A, 10B is controlled by a control signal 31 outputted from the control circuit 16. The Miller integrating circuit 12 performs the first integral operation of integrating the difference voltage of the correction voltage Vx with respect to the voltage Vin of the first node N1 and the second integral operation of integrating the difference voltage of the first voltage Vp with respect to the voltage Vin of the first node N1. A hysteresis comparator 14A that generates a detection pulse (the first detection signal) 15A when an integral output of the Miller integrating circuit 12 reaches the first voltage Vp in the first integral operation and a hysteresis comparator 14B that generates a detection pulse (the second detection signal) 15B when the output of the Miller integrating circuit 12 reaches the correction voltage Vx in the second integral operation are arranged as comparator circuits.

The first detection signal 15A and the second detection signal 15B are supplied to the control circuit 16. The control circuit 16 operates by using a clock signal CK outputted from a clock generation circuit (CPG) 19 as a reference clock, and performs control of a counter 20 for counting the clock signal CK, selective control of the selective switches 10A, 10B, etc. The control circuit 16 controls operations that accumulates in a register 17 a first count value N counted by the counter 20 in a period spanning from making the integrating circuit 12 start the first integral operation by selecting the correction voltage Vx with the selective switch 10B until a first detection signal 14A is generated, and further accumulates in a register 18 a second count value n counted by the counter 20 in a period spanning from making the integrating circuit 12 start the second integral operation by selecting the first voltage Vp with the selective switch 10A until a second detection signal 14B is generated.

According to a configuration of FIG. 1, when one of the selector switches 4A, 4B, and 4C is selected, a current flowing into the second voltage Vn from the first voltage Vp is designated as I. At this time, the voltage Vin of the first node N1 is a sum (Vin=Vn+IRm+Iron) of the second voltage Vn, a drop voltage IRm by the measurement resistance Rm, and a drop voltage Iron by the on-resistance of the selector switch. Moreover, the correction voltage Vx is a sum (Vx=Vn+Iron) of the second voltage Vn and the drop voltage Iron by the selector switch. Therefore, an integral time t1 of the first integral operation elapsed when the difference voltage (Vin−Vx=IRm) of the correction voltage Vx to the voltage Vin of the first node N1 is integrated to the first voltage Vp does not include a component of an on-resistance Ron of the selector switches 4A, 4B, and 4C. Moreover, since the first voltage Vp is a sum (Vp=Vn+IRm+Iron+IRpu) of the second voltage Vn, the drop voltage IRm by the measurement resistance Rm, the drop voltage Iron by the selector switch, and the drop voltage IRpu by the reference resistance Rpu, the integral time t2 of the second integral operation when the difference voltage (Vin−Vp=−IRpu) of the first voltage Vp to the voltage Vin of the first node N1 is integrated to the correction voltage Vx does not include the component of the on-resistance Ron of the selector switches 4A, 4B, and 4C.

Figure 2:
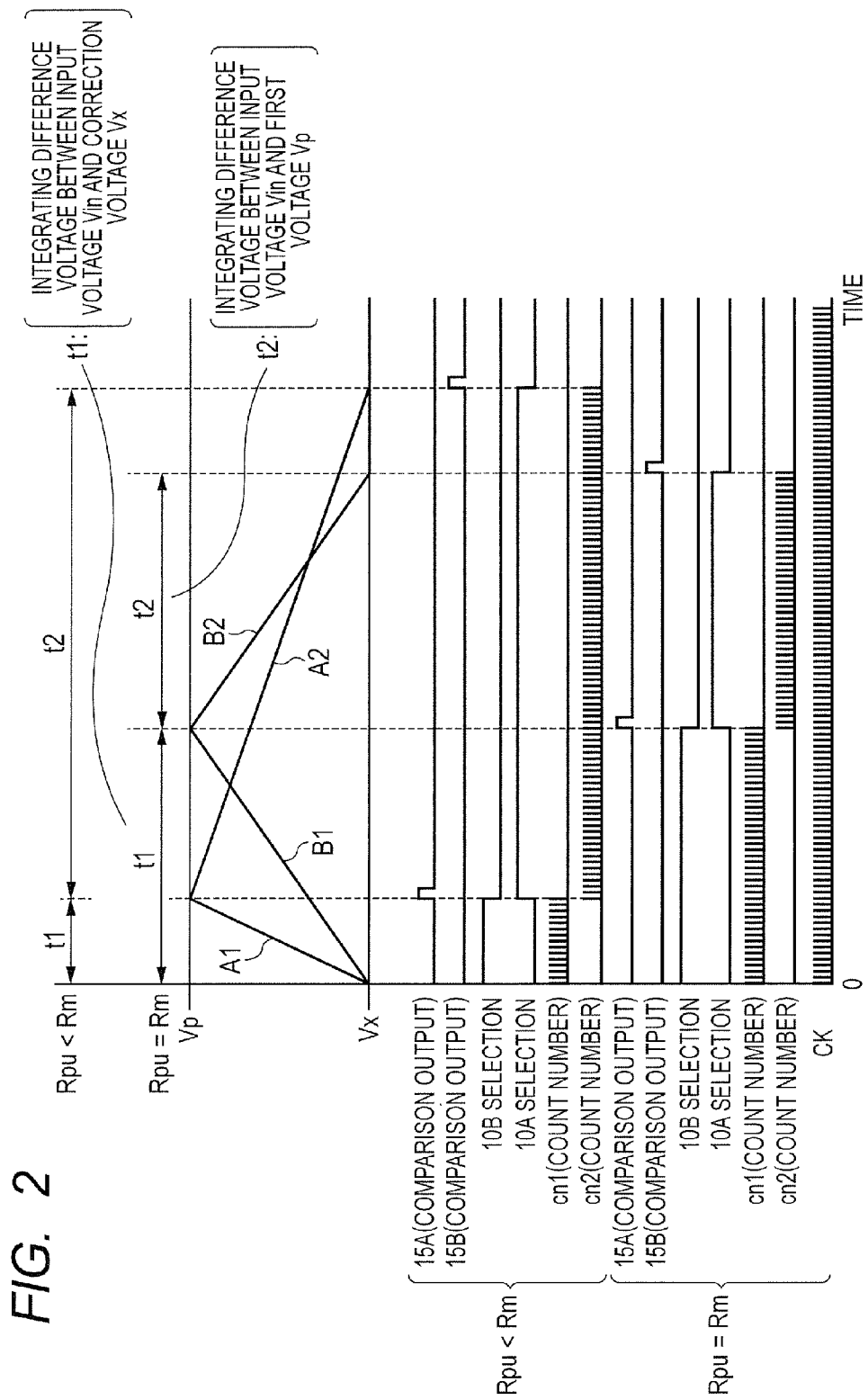
FIG. 2 is a timing chart for illustrating operation timings of a first integral operation and a second integral operation.

FIG. 2 illustrates a timing chart of the first integral operation and the second integral operation. Waveforms A1, A2 of FIG. 2 show an integral waveform of the first integral operation and an integral waveform of the second integral operation, respectively, performed by the Miller integrating circuit 12 in the case of Rpu<Rm. Waveforms B1, B2 of FIG. 2 show an integral waveform of the first integral operation and an integral waveform of the second integral operation, respectively, performed by the Miller integrating circuit 12 in the case of Rpu=Rm. Since the component of the on-resistance Ron of the selector switches 4A, 4B, and 4C is included in neither the waveform of the first integral operation nor the waveform of the second integral operation, as described above, t1=t2 holds as shown in the integral waveforms B1, B2 in the case of Rpu=Rm.

As is clear from the explanation described above, the voltage drop by the on-resistance Ron of the selector switches 4A, 4B, and 4C affect neither the first integral operation nor the second integral operation performed by the Miller integrating circuit 12.

Next, how to acquire a value of the measurement resistance Rm by using count values cn1, cn2 that are made to correspond to t1, t2 for integral operation times obtained by the first integral operation and the second integral operation, respectively, without being affected by the voltage drop by the on-resistance Ron of the selector switches 4A, 4B, and 4C will be explained using mathematical expressions.

A charging operation of the waveform A1 of FIG. 2 can be expressed by Formula 6 and a charging operation of the waveform A2 of FIG. 2 can be expressed by Formula 7.

[Formula 6]

$$Vp - Vx = \frac{Vin - Vx}{Rc} t_1 \quad (6)$$

[Formula 7]

$$Vx - Vp = \frac{Vin - Vp}{RC} t_2 \quad (7)$$

If t1 and t2 are set to N and n, respectively, Formula 8 will be obtained from Formula 6 and Formula 7.

[Formula 8]

$$n = \frac{Vin - Vx}{Vp - Vin} \cdot N \quad (8)$$

Meanings of parameters in Formulae 6 to 8 are as follows. n: digital output (a count number in the period t2), N: count number in the period t1, Vin: voltage of the first node (an input voltage), Vx: output voltage of the correction circuit, and Vp: first voltage.

Here, the input voltage Vin and the output voltage Vx of the correction circuit can be expressed by Formula 9 and Formula 10, respectively.

[Formula 9]

$$Vin = \frac{Rm + Ron}{Rpu + Rm + Ron} \cdot Vp + \frac{Rpu}{Rpu + Rm + Ron} \cdot Vn \quad (9)$$

[Formula 10]

$$Vx = \frac{Ron}{Rpu + Rm + Ron} \cdot Vp + \frac{Rpu + Rm}{Rpu + Rm + Ron} \cdot Vn \quad (10)$$

Formula 11 can be obtained from Formula 8 to Formula 10.

[Formula 11]

$$n = \frac{Rm}{Rpu} \cdot N \Rightarrow Rm = \frac{n}{N} \cdot Rpu \quad (11)$$

According to Formula 11, the measurement resistance Rm can be measured from the count number N in the period t1, the count number n in the period t2, and the reference resistance Rpu. A resistance value of the measurement resistance Rm can be measured without being affected by the Ron that is the on-resistance of the selector switches 4A, 4B, and 4C also with the formula. Such a calculation may be performed using an arithmetic unit that is a microcomputer (MCU) etc.

Figure 9:
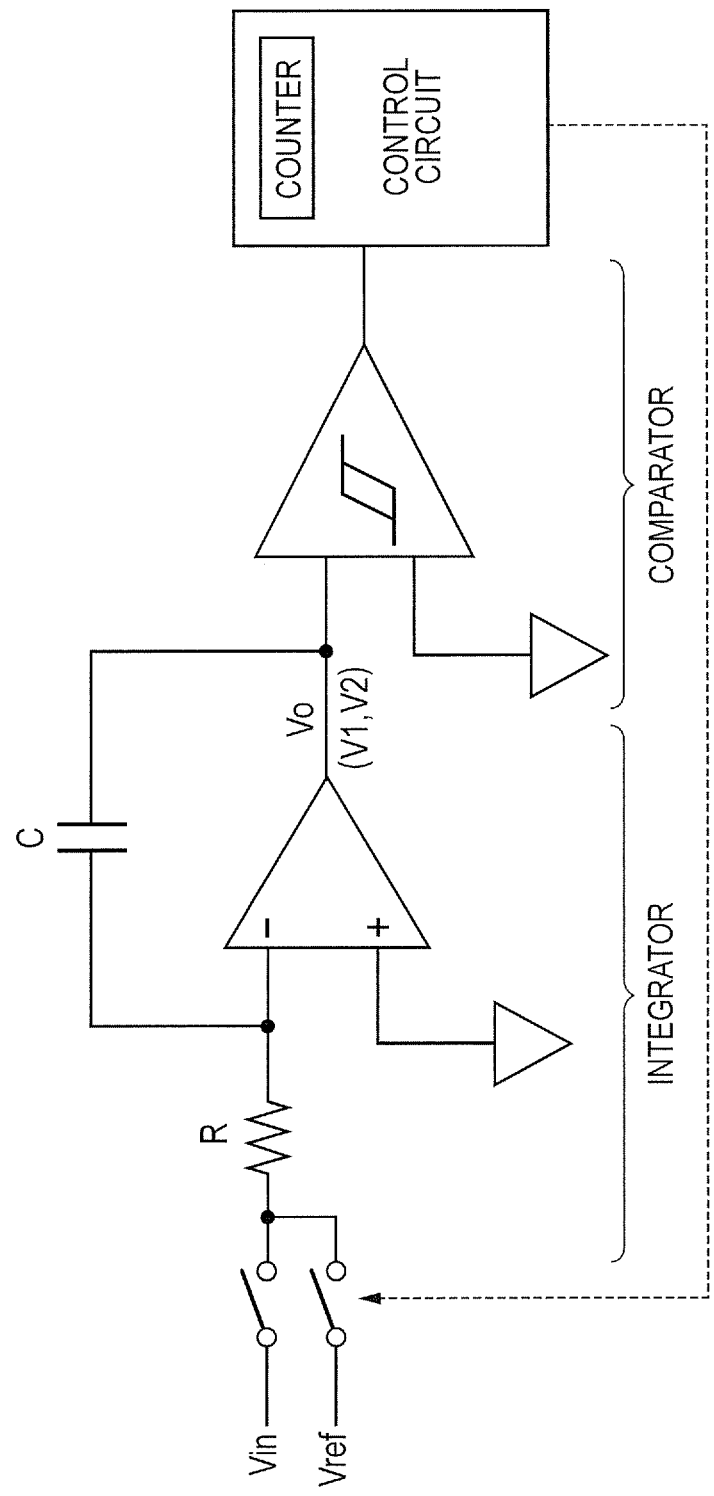
FIG. 9 is an explanatory diagram of the double integral analog-digital conversion circuit having been provided in the related art.
Figure 10:
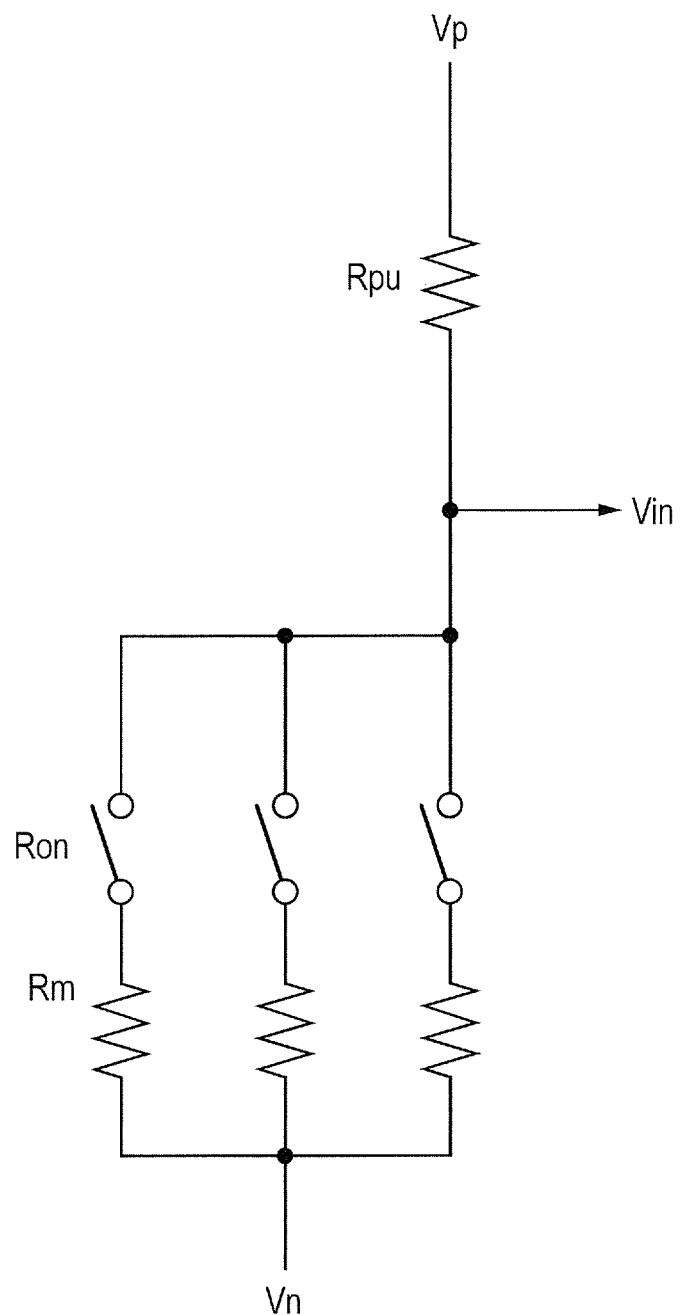
FIG. 10 is a circuit diagram for illustrating an input circuit that forms an input voltage of the double integral analog-digital conversion circuit by coupling the measurement resistance selected by a multiplexer to a reference resistance in series.

Here, in the case where the measurement resistance Rm is set to 400Ω and the on-resistance Ron of the selector switches 4A, 4B, and 4C is set to 100Ω, the measurement result according to the related art of FIG. 9 and FIG. 10 and the measurement result according to the technology of FIG. 1 are compared concretely.

Parameters are set to Vp=3.6 V, Vn=2.4 V, and Rpu=2 kΩ as known values.

[Formula 12]

$$\left. \begin{array}{l} Rm + Ron = \dfrac{Vn - Vin}{Vin - Vp} \cdot Rpu \\ Vin = \dfrac{Rm + Ron}{Rpu + Rm + Ron} \cdot Vp + \dfrac{Rpu}{Rpu + Rm + Ron} \cdot Vn \end{array} \right\} \quad (12)$$

From Formula 12 in the related art, the followings become to be set: Vin=2.64 V and Rm+Ron=500Ω. In a practical use, since the value of the on-resistance of the selector switch is unknown, the resistance value of the measurement resistance Rm will be measured to be a value larger than an actual value.

In contrast to this, in the case where the measurement resistance Rm is found by the method explained in FIG. 1, since Vx becomes Vx=2.448 V by Formula 13 and n/N=0.2 is found, Rm can be measured correctly as Rm=0.2×2 kΩ=400Ω.

[Formula 13]

$$\left. \begin{array}{l} Rm = \dfrac{n}{N} \cdot Rpu \\ \dfrac{n}{N} = \dfrac{Vin - Vx}{Vp - Vin} \\ Vx = \dfrac{Ron}{Rpu + Rm + Ron} \cdot Vp + \dfrac{Rpu + Rm}{Rpu + Rm + Ron} \cdot Vn \end{array} \right\} \quad (13)$$

As is clear from the above, the influence of the on-resistance Ron of the selector switches 4A, 4B, and 4C is given to neither the first integral operation nor the second integral operation performed by the Miller integrating circuit 12, and it is possible to suppress the detection accuracy of the measurement resistance Rm from decreasing caused by the on-resistance Ron of the selector switches 4A, 4B, and 4C.

It is conceivable that the measurement resistance Rm is used in a range of resistance value of 20Ω to 400Ω. At this time, in the related art, since the on-resistance of the selector switch will be added to the measurement resistance as it is, it turns out that in the case where the resistance value of the measurement resistance Rm is small, the measurement resistance Rm is susceptible to be affected by the on-resistance of the selector switch as is illustrated in FIG. 11. Moreover, with a technology using a relative ratio like the double integral ADC, it is difficult to perform an accurate resistance measurement because measurement accuracy affected by addition of the on-resistance of the selector switch differs depending on the measurement resistance value Rm.

Therefore, in the above-mentioned embodiment, it is possible to measure the resistance value of the measurement resistance with high precision.

Figure 3:
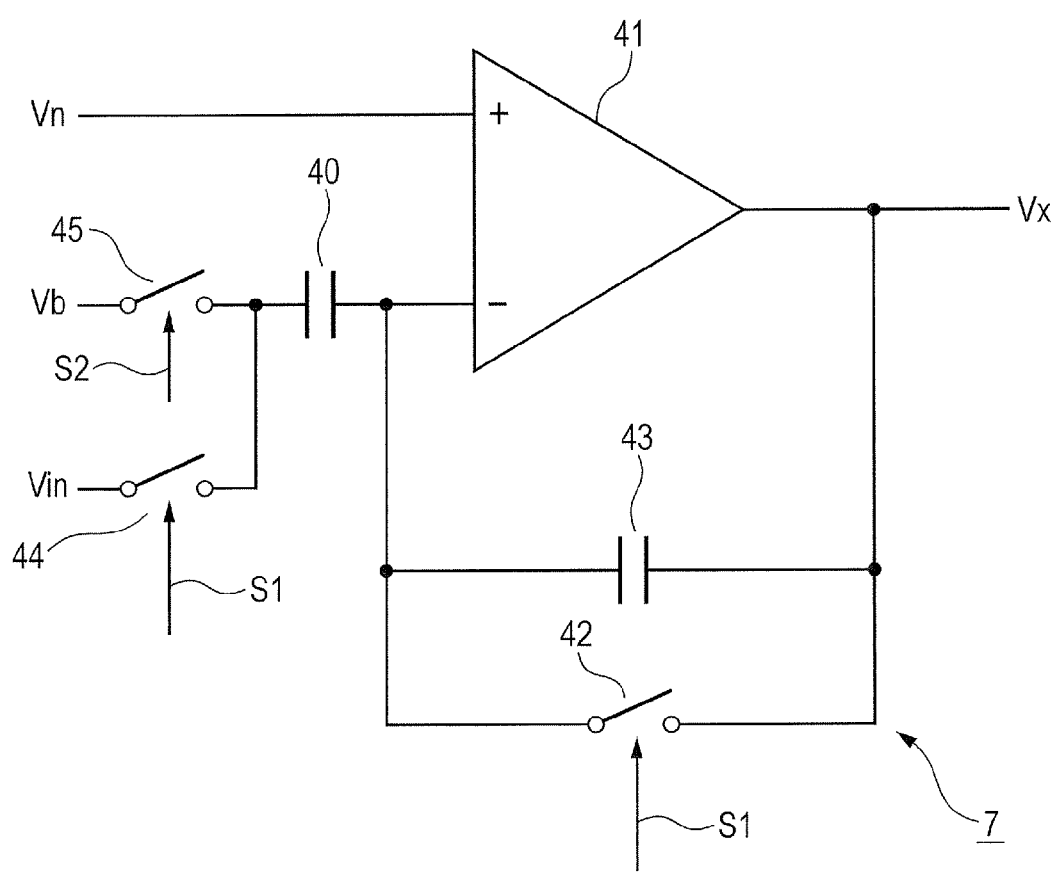
FIG. 3 is a block diagram showing another example of a correction circuit.

FIG. 3 shows another example of the correction circuit 7. The correction circuit shown in FIG. 3 is comprised with the use of a switched capacitor while the buffer amplifier by a voltage follower amplifier is ceased to be used. That is, the correction circuit 7 has an operational amplifier 41 that receives the second voltage Vn at its noninverting input terminal (+) and to which one capacitance electrode of an input capacitance 40 is bound at its inverting input terminal (−). A feedback switch 42 that makes feedback coupling of an output terminal of the operational amplifier 41 to the inverting input terminal (−) and a feedback capacitance 43 that is coupled to the feedback switch 42 in parallel are provided. The feedback switch 42 is switch-controlled by a control signal S1. An input switch 44 that is switch-controlled by the control signal S1 in phase with the feedback switch 42 is arranged and this input switch 44 applies the voltage Vin of the first node N1 to the other capacitance electrode of the input capacitance 40 in the ON state. Moreover, an input switch 45 that is switch-controlled by a control signal S2 in reverse phase with the input switch 44 is arranged, and the input switch 45 applies the voltage Vb of the second nodes N2 to the other capacitance electrode of the input capacitance 40 in the ON state.

Figure 4:
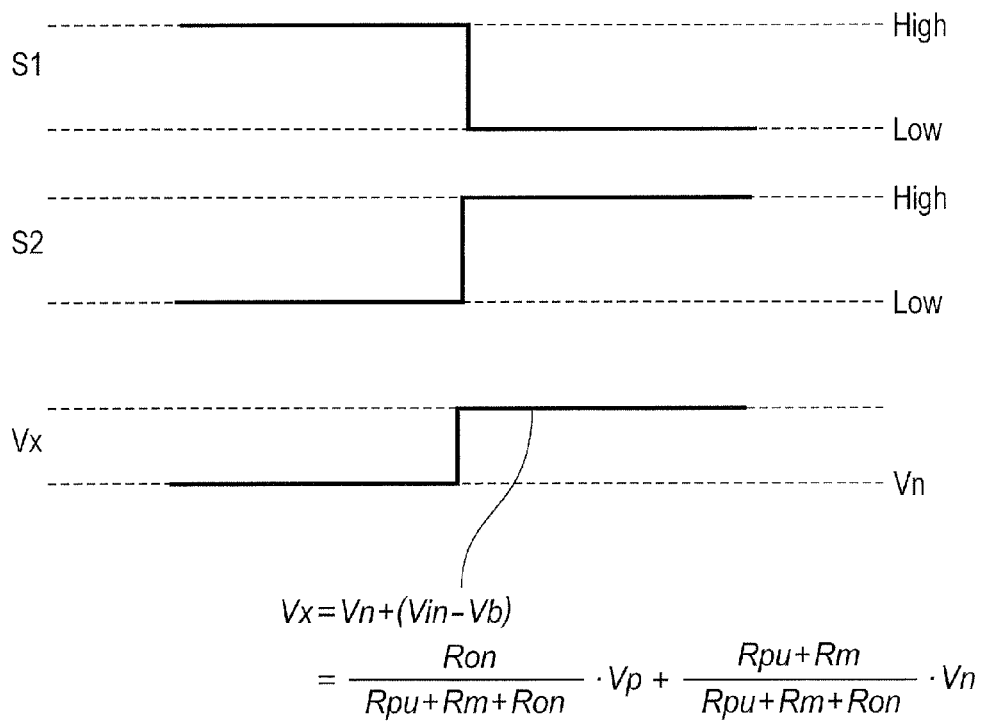
FIG. 4 is a timing chart for illustrating an operation timing of the correction circuit of FIG. 3.

FIG. 4 illustrates an operation timing of the correction circuit 7 of FIG. 3. The control signals S1, S2 turn on the corresponding switches 43, 44, and 45 with their high levels (High), and turn off the corresponding switches 43, 44, and 45 with their low levels (Low). First, S1 is set to the high level and S2 is set to the low level, which makes the feedback capacitance 43 reset, and an output Vx of the operational amplifier 41 is initialized to Vn. After this, the correction voltage of Vx=Vn+(Vin−Vb) can be generated by the control signals S1, S2 being reversed.

Although the correction circuit 7 of FIG. 3 can be reduced in circuit scale compared with FIG. 1 by an amount that it does not require the buffer amplifiers 22, 23, it must be taken care that a time until the correction voltage Vx is decided becomes long compared with FIG. 1.

Figure 5:
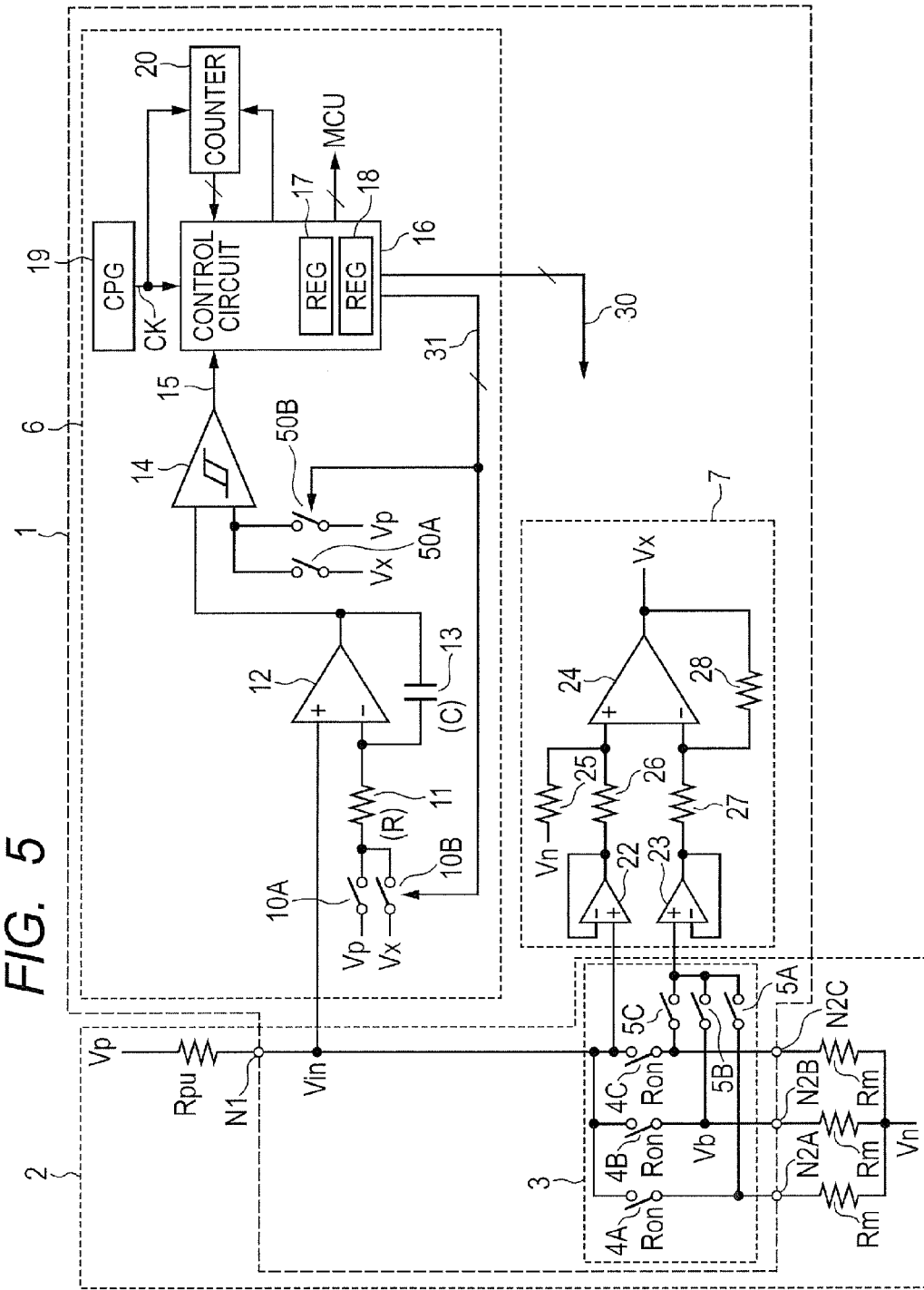
FIG. 5 is a block diagram for illustrating the double integral analog-digital conversion circuit that adopts another example of a comparator circuit.

FIG. 5 shows another example of the comparator circuit in the double integral ADC 1. Here, the comparator circuit uses one hysteresis comparator 14 and makes it possible to compare the correction voltage Vx selected by a selective switch 50A or the first voltage Vp selected by a selective switch 50B with an output of the integrating circuit 12. Selection of the selective switches 50A, 50B is controlled by the control signal 31 in the same mode as that of the switches 10A, 10B. That is, the switches 10B, 50B and the switches 10A, 50B are switch controlled complementarily.

Thereby, the number of hysteresis comparators can be reduced by half.

<<Second Embodiment of Second Semiconductor Device>>

FIG. 6 shows a second example of a semiconductor device having the double integral analog-digital conversion circuit. Although a semiconductor device 1A shown in the figure is especially not limited, it is formed over one semiconductor substrate as of single crystal silicon by a known CMOS integrated circuit manufacturing technology. Points of difference from FIG. 1 are that a double integral ADC 6A for inputting therein the second voltage of the second nodes N2A, N2B, and N2C as the input voltage Vin is adopted and that a correction circuit 7A for generating the correction voltage Vx by adding the on-resistance Ron to the first voltage Vp is adopted. The semiconductor device 1A will be described below focusing on the points of difference.

In order that the semiconductor device 1A configures the input circuit 2 through the above-mentioned reference resistance Rpu and the multiple measurement resistances Rm, the semiconductor device 1A has: a first node N1 coupled to the first voltage Vp through the reference resistance Rpu; the multiple second nodes N2A, N2B, and N2C coupled to the second voltage Vn through the measurement resistances Rm, respectively; and the multiple selector switches 4A, 4B, and 4C for selecting one of the second nodes N2A, N2B, and N2C to be coupled to the first node. On-resistance of the selector switches 4A, 4B, and 4C is designated as Ron. By any one of the selector switches 4A, 4B, and 4C being turned on, a current path extending from the first voltage Vp to the second voltage Vn is formed, and the voltage of the first node N1 and the voltage of the second nodes N2$i$ both of which are formed by resistance voltage division are shown in the figure as Vc and Vin, respectively. The selective switches 5A, 5B, and 5C for inputting the voltages of the selected selector switches 4A, 4B, and 4C on sides of the second nodes N2A, N2B, and N2C in response to the on-operation of the selector switches 4A, 4B, and 4C are arranged. The selector switches 4A, 4B, and 4C and the selective switches 5A, 5B, and 5C form a detection channel switching circuit 3A. Although being especially not limited, the switch control for the detection channel switching circuit 3A is performed by the control signal 30 outputted from the control circuit 16 or is performed by another logic circuit whose illustration is omitted. Incidentally, the first voltage Vp and the second voltage Vn may be voltages generated by a power supply circuit of the semiconductor device 1, or may be voltages given from the outside of the semiconductor device 1.

The semiconductor device 1A has the double integral analog-digital conversion circuit (also described as the double integral ADC) 6A and the correction circuit 7A.

The correction circuit 7A generates a voltage obtained by subtracting a voltage between the second node N2A, N2B, or N2C selected by the selector switches 4A, 4B, and 4C and the first node N1 from the first voltage Vp as the correction voltage Vx. For example, in FIG. 6, the correction circuit 7 has: the first buffer amplifier 22 that receives a voltage Vc of the first node N1; the second buffer amplifier 23 that receives the voltage Vin of the second node N2A, N2B, or N2C selected by the selector switches 4A, 4B, and 4C through the selective switch 5A, 5B, or 5C; and the differential amplifier 24 that forms a voltage obtained by adding the first voltage Vp to a difference voltage of the output of the first buffer amplifier 22 with respect to the output of the second buffer amplifier 23 as the correction voltage Vx. The resistances 25, 26, 27, and 28 are for gain adjustment.

The double integral ADC 6A is for finding the first integral time t1 elapsed when the difference voltage of the correction voltage Vx with respect to the voltage Vin of the second nodes N2A, N2B, and N2C is integrated to the second voltage Vx and the second integral time t2 elapsed when a difference voltage of the second voltage Vn with respect to the voltage Vin of the second nodes N2A, N2B, and N2C is integrated to the correction voltage Vx. Further in detail, the double integral ADC 6A has, in its first stage, the Miller integrating circuit 12 that receives the voltage Vin at its noninverting input terminal (+) and receives the second voltage Vn selected by the switches 10A, 10B or the correction voltage Vx at its inverting input terminal (−). 13 is the integral capacity (C) and 11 is the integral resistor (R). Selection of the switches 10A, 10B is controlled by the control signal 31 outputted from the control circuit 16. The Miller integrating circuit 12 performs the first integral operation of integrating the difference voltage of the correction voltage Vx with respect to the voltage Vin and the second integral operation of integrating the difference voltage of the second voltage Vn with respect to the voltage Vin. The hysteresis comparator 14A that generates the detection pulse (the first detection signal) 15A when the integral output of the Miller integrating circuit 12 reaches the first voltage Vn in the first integral operation and the hysteresis comparator 14 that generates the detection pulse (the second detection signal) 15B when the output of the Miller integrating circuit 12 reaches the correction voltage Vx in the second integral operation are arranged as the comparator circuits.

The first detection signal 15A and the second detection signal 15B are supplied to the control circuit 16. The control circuit 16 operates using the clock signal CK outputted from the clock generation circuit (CPG) 19 as a reference clock, and performs control of the counter 20 for counting the clock signal CK, selection control of the selective switches 10A, 10B, etc. The control circuit 16 controls operations that accumulates, in the register 17, the first count value N counted by the counter 20 in a period spanning from making the integrating circuit 12 start the first integral operation by selecting the correction voltage Vx with the selective switch 10B until the first detection signal 14A is generated, and further accumulates, in the register 18, the second count value n counted by the counter 20 in a period spanning from making the integrating circuit 12 start the second integral operation by selecting the first voltage Vp with the selective switch 10A until the second detection signal 14B is generated.

According to a configuration of FIG. 6, when one of the selector switches 4A, 4B, and 4C is selected, a current flowing into the second voltage Vn from the first voltage Vp is designated as I. At this time, the voltage Vc of the first node N1 is a sum (Vc=Vn+IRm+Iron) of the second voltage Vn, the drop voltage IRm by the measurement resistance Rm, and the drop voltage Iron by the on-resistance of the selector switch. Moreover, the correction voltage Vx is a difference (Vx=Vp−Iron) between the first voltage Vp and the drop voltage Iron by the selector switch. The first voltage Vp can be expressed as a sum (Vp=Vn+IRm+Iron+IRpu) of the second voltage Vn, the drop voltage IRm by the measurement resistance Rm, the drop voltage Iron by the selector switch, and the drop voltage IRpu by the reference resistance Rpu. Therefore, the integral time t1 of the first integral operation elapsed when the difference voltage (Vin−Vx=−IRpu) of the correction voltage Vx to the voltage Vin of the second nodes N2A, N2B, and N2C is integrated to the first voltage Vn does not include the component of the on-resistance Ron of the selector switches 4A, 4B, and 4C. On the other hand, similarly, the second integral time t2 of the second integral operation when the difference voltage (Vin−Vn=IRm) of the second voltage Vn to the voltage Vin of the second nodes N2A, N2B, and N2C is integrated to the correction voltage Vx does not include the component of the on-resistance Ron of the selector switches 4A, 4B, and 4C. Therefore, the voltage drop by the on-resistance Ron of the selector switches 4A, 4B, and 4C affects neither the first integral operation nor the second integral operation performed by the Miller integrating circuit 12. Therefore, since the influence of the on-resistance of the selector switch comes to be consistent between the first integral and the second integral of the double integral, it is possible to suppress the detection accuracy of the measurement resistance from decreasing caused by the on-resistance of the selector switch.

In the circuit configuration of FIG. 6, a relationship corresponding to Formula 8 becomes Formula 14.

[Formula 14]

$$n = \frac{Vin - Vn}{Vx - Vin} \cdot N \qquad (14)$$

Here, the input voltage Vin and the output voltage Vx of the correction circuit are expressed by Formula 15 and Formula 16, respectively.

[Formula 15]

$$Vin = \frac{Rm}{Rpu + Rm + Ron} \cdot Vp + \frac{Rpu + Ron}{Rpu + Rm + Ron} \cdot Vn \qquad (15)$$

[Formula 16]

$$Vx = \frac{Rpu + Rm}{Rpu + Rm + Ron} \cdot Vp + \frac{Ron}{Rpu + Rm + Ron} \cdot Vn \qquad (16)$$

Formula 17 can be obtained from Formula 14 to Formula 16.

[Formula 17]

$$n = \frac{Rm}{Rpu} \cdot N \Rightarrow Rm = \frac{n}{N} \cdot Rpu \qquad (17)$$

According to Formula 17, the measurement resistance Rm can be measured from the count number N in the period t1, the count number n in the period t2, and the reference resistance Rpu. Since the component of the on-resistance Ron of the selector switches 4A, 4B, and 4C is not included in this operation, the resistance value of the measurement resistance can always be acquired with high precision regardless of a resistance ratio of the reference resistance Rpu and the measurement resistance Rm. In order to perform such an operation, what is necessary is just to perform it using an arithmetic unit such as a microcomputer (MCU).

Since other points are the same as those of FIG. 1, their detailed explanations are omitted.

Figure 7:
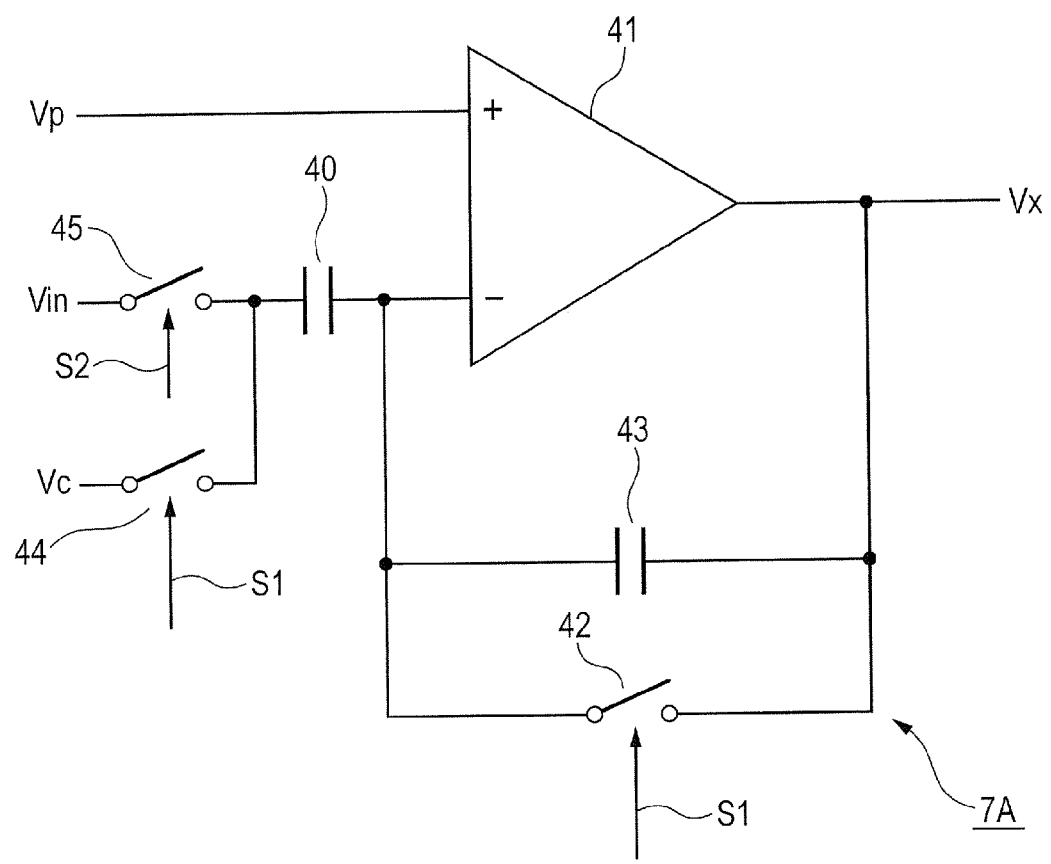
FIG. 7 is a block diagram for showing another example of the correction circuit.

FIG. 7 shows another example of the correction circuit 7A. It is comprised with the use of a switched capacitor like FIG. 3. That is, the correction circuit 7A has the operational amplifier 41 that receives the first voltage Vp at its noninverting input terminal (+) and to which the one capacitance electrode of the input capacitance 40 is bound at its inverting input terminal (−). The feedback switch 42 that makes feedback coupling of the output terminal of the operational amplifier 41 to the inverting input terminal (−) and the feedback capacitance 43 that is coupled to the feedback switch 42 in parallel are provided. The feedback switch 42 is switch-controlled by the control signal S1. The input switch 44 that is switch-controlled by the control signal S1 in phase with the feedback switch 42 is arranged, and this input switch 44 applies the voltage Vc of the first node N1 to the other capacitance electrode of the input capacitance 40 in the ON state. Moreover, the input switch 45 that is switch-controlled by the control signal S2 in reverse phase with the input switch 44 is arranged, and the input switch 45 applies the voltage Vin of the second nodes N2A, N2B, and N2C to the other capacitance electrode of the input capacitance 40 in the ON state.

Although an operation timing is not illustrated in particular, like FIG. 4, the control signals S1, S2 turn on the corresponding switches 43, 44, and 45 with their high levels (High), and turn off the corresponding switches 43, 44, and 45 with their low levels (Low). First, S1 is set to the high level and S2 is set to the low level, which resets the feedback capacitance 43 and initializes the output Vx of the operational amplifier 41 to Vp. After this, the correction voltage of Vx=Vp+(Vin−Vc) can be generated by the control signals S1, S2 being reversed.

<<One Embodiment of Electronic Control Device>>

Figure 8:
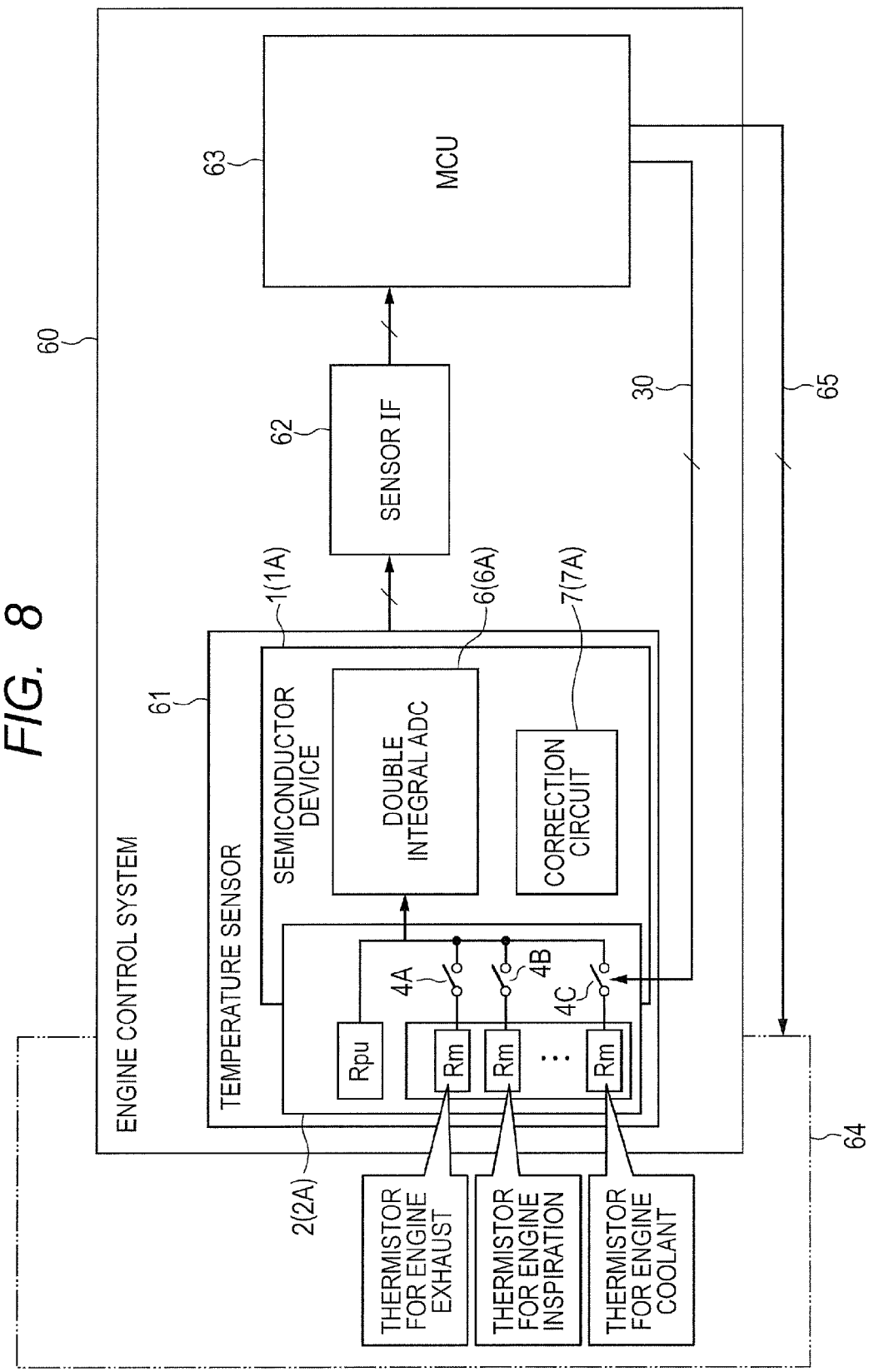
FIG. 8 is a block diagram for illustrating an engine control system mounted on an automobile as one example of an electronic control device.

FIG. 8 illustrates an engine control system mounted on an automobile as one example of the electronic control device. A control object of an engine control system 60 is an engine 64, and the system performs engine control of a mixing ratio of gasoline and air, ignition timing, etc. by measuring temperatures of engine exhaust, inspiration, coolant, etc. The engine control system 60 has the semiconductor device 1 (1A) comprised of the semiconductor circuit 1(1A) and the input circuit 2 (2A). A configuration of a temperature sensor 61 is as explained based on FIG. 1, FIG. 6, etc. The measurement resistance Rm is, for example, a thermistor for engine exhaust, a thermistor for engine inspiration, a thermistor for engine coolant, etc. A microcomputer 63 calculates the resistance value of the measurement resistance Rm based on Formula 11, Formula 17, etc., generates a control signal 65 using the calculation result, and performs engine control with this.

For delivery of the count values N, n by the first integral operation and the second integral operation, interruption is used, for example. Specifically, when the count values N, n are acquired in the four registers 17, 18 by the temperature sensor 61 performing the above-mentioned first integral operation and second integral operation periodically using respective measurement resistances, the control circuit outputs an interrupt request signal IRQ to the microcomputer 63. In response to the interrupt request, the microcomputer 63 starts an arithmetic processing routine of the measurement resistance. By this, the resistance value of the measurement resistance Rm is calculated and control of the automobile engine is performed according to the calculation result. Since the count values N, n can be measured with high precision as described above, it is possible to acquire the resistance value with high precision for the measurement resistance Rm. That is, it is possible to perform the engine control, such as of temperature of the engine etc. with high precision.

The measurement resistance is not limited to the thermistor used for thermometry. The measurement resistance may be the photoconductive cell used for photodetection. A CDS photoconductive cell used for an optical sensor has a characteristic that when it is bright, its resistance becomes low, and when it is dark, the resistance becomes high. Therefore, it becomes possible to detect brightness of light with a resistance value acquired by the double integral ADC. The measurement resistance may be a resistance element used for gas concentration measurement. The gas concentration sensor also exhibits rise and fall of its resistance value depending on a concentration of gas, which makes it possible to detect the concentration with the resistance value.

The present invention is not limited to the above-mentioned embodiments and it goes without saying that it can be modified variously without deviating from its gist.

For example, the resistance used for the input circuit of the double integral ADC is not limited to the resistance element, but it can be comprised of an on-resistance of a transistor, a switched capacitor, or the like. The measurement resistance is not limited to the thermistor for thermometry, the photoconductive cell of the optical sensor, and the resistance element of the gas concentration sensor, but can be modified suitably. Moreover, in each of FIG. 1 and FIG. 6, the semiconductor device is also configurable with a voltage polarity being reversed as a whole. The electronic control device is widely applicable to other in-vehicle systems, industrial facilities, household systems, etc., not being limited to the engine control system.

What is claimed is:

1. A semiconductor device, comprising:
   a first node coupled to a first voltage through a reference resistance;
   a plurality of second nodes coupled to a second voltage through measurement resistances;
   a plurality of selector switches for selecting the second node to be coupled to the first node;
   a correction circuit that generates a voltage obtained by adding the second voltage to a voltage between the second node selected by the selector switches and the first node as a correction voltage; and
   a double integral analog-digital conversion circuit that finds a first integral time elapsed when a difference voltage of the correction voltage with respect to a voltage of the first node is integrated to the first voltage and a second integral time elapsed when a difference voltage of the first voltage with respect to the voltage of the first node is integrated to the correction voltage.

2. The semiconductor device according to claim 1, wherein the double integral analog-digital conversion circuit has:
   an integrating circuit that performs a first integral operation of integrating the difference voltage of the correction voltage with respect to the voltage of the first node and a second integral operation of integrating the difference voltage of the first voltage with respect to the voltage of the first node;
   a detection circuit that generates a first detection signal when an integral output of the integrating circuit reaches the first voltage in the first integral operation and generates a second detection signal when the integral output of the integrating circuit reaches the correction voltage in the second integral operation;
   a counter for counting a clock signal; and
   a control circuit that acquires a first count value by the counter from when the first count operation is started by the integrating circuit until the first detection signal is generated, and a second count value by the counter from when the second count operation is started thereby until the second detection signal is generated.

3. The semiconductor device according to claim 2,
wherein the integrating circuit is a Miller integrating circuit that receives the voltage of the first node at its noninverting input terminal and receives selectively the first voltage or the correction voltage at its inverting input terminal.

4. The semiconductor device according to claim 1,
wherein the correction circuit has:
a first buffer amplifier for receiving the voltage of the first node;
a second buffer amplifier for receiving a voltage of the second node selected by the selector switches; and
a differential amplifier that forms a voltage obtained by adding the second voltage to a difference voltage of an output of the second buffer amplifier with respect to an output of the first buffer amplifier as the correction voltage.

5. The semiconductor device according to claim 1,
wherein the correction circuit includes:
an operational amplifier that receives the second voltage at its noninverting input terminal and to which one capacitance electrode of an input capacitance is bound at its inverting input terminal;
a first switch that makes feedback coupling of an output terminal of the operational amplifier to the inverting input terminal;
a feedback capacitance that is coupled to the first switch in parallel;
a second switch that is switch-controlled in phase with the first switch and applies the voltage of the first node to the other capacitance electrode of the input capacitance in the ON state; and
a third switch that is switch-controlled in reverse phase with the first switch and applies a voltage of the second nodes to the other capacitance electrode of the input capacitance in the ON state.

6. The semiconductor device according to claim 1,
wherein the first node and the second nodes are external terminals.

7. A semiconductor device, comprising:
a first node coupled to a first voltage through a reference resistance;
a plurality of second nodes coupled to a second voltage through measurement resistances;
a plurality of selector switches for selecting the second node to be coupled to the first node;
a correction circuit that generates a voltage obtained by subtracting a voltage between the second node selected by the selector switches and the first node from the first voltage as a correction voltage; and
a double integral analog-digital conversion circuit that finds a first integral time elapsed when a difference voltage of the correction voltage with respect to a voltage of the second nodes is integrated to the second voltage and a second integral time elapsed when a difference voltage of the second voltage with respect to the voltage of the second nodes is integrated to the correction voltage.

8. The semiconductor device according to claim 7,
wherein the double integral analog-digital conversion circuit has:
an integrating circuit that performs a first integral operation of integrating the difference voltage of the correction voltage with respect to the voltage of the second nodes and a second integral operation of integrating the difference voltage of the second voltage with respect to the voltage of the second nodes;
a detection circuit that generates a first detection signal when an integral output of the integrating circuit reaches the second voltage in the first integral operation and generates a second detection signal when an integral output of the integrating circuit reaches the correction voltage in the second integral operation;
a counter for counting a clock signal; and
a control circuit that acquires a first count value by the counter from when the first integral operation is started by the integrating circuit until the first detection signal is generated and a second count value by the counter from when the second integral operation is started by the integrating circuit until the second detection signal is generated.

9. The semiconductor device according to claim 8,
wherein the integrating circuit is a Miller integrating circuit that receives the voltage of the second nodes at its noninverting input terminal and receives selectively the second voltage or the correction voltage at its inverting input terminal.

10. The semiconductor device according to claim 7,
wherein the correction circuit has:
a first buffer amplifier for receiving a voltage of the first node;
a second buffer amplifier for receiving the voltage of the second node selected by the selector switches; and
a differential amplifier that forms a voltage obtained by subtracting a difference voltage of an output of the second buffer amplifier with respect to an output of the first buffer amplifier from the first voltage as the correction voltage.

11. The semiconductor device according to claim 7,
wherein the correction circuit includes:
an operational amplifier that receives the first voltage at its noninverting input terminal and to which one capacitance electrode of an input capacitance is bound at its inverting input terminal;
a first switch that makes feedback coupling of an output terminal of the operational amplifier to the inverting input terminal;
a feedback capacitance that is coupled to the first switch in parallel;
a second switch that is switch-controlled in phase with the first switch and applies the voltage of the first node to the other capacitance electrode of the input capacitance in the ON state; and
a third switch that is switch-controlled in reverse phase with the first switch and applies the voltage of the second nodes to the other capacitance electrode of the input capacitance in the ON state.

12. The semiconductor device according to claim 7,
wherein the first node and the second nodes are external terminals.

13. An electronic control device, comprising:
a plurality of measurement resistances provided in a control object apparatus;
a reference resistance;
a first node coupled to a first voltage through the reference resistance;
a plurality of second nodes coupled to a second voltage through the measurement resistances;
a plurality of selector switches for selecting the second node to be coupled to the first node;
a correction circuit for generating a voltage obtained by adding the second voltage to a voltage between the second node selected by the selector switches and the first node as a correction voltage;

a double integral analog-digital conversion circuit that finds a first integral time elapsed when a difference voltage of the correction voltage with respect to a voltage of the first node is integrated to the first voltage and a second integral time elapsed when a difference voltage of the first voltage with respect to the voltage of the first node is integrated to the correction voltage; and a control part that inputs therein the first integral time and the second integral time, calculates a value obtained by multiplying a rate of the first integral time to the second integral time by a resistance value of the reference resistance as a resistance value of the measurement resistance, and controls the control object apparatus based on the calculation result.

14. The electronic control device according to claim 13, wherein the measurement resistance is a thermistor used for thermometry.

15. The electronic control device according to claim 14, wherein the control object apparatus is an automobile engine.

16. The electronic control device according to claim 13, wherein the measurement resistance is a photoconductive cell used for photodetection.

17. The electronic control device according to claim 13, wherein the measurement resistance is a resistance element used for gas concentration measurement.

18. An electronic control circuit, comprising:

a plurality of measurement resistances provided in a control object apparatus;

a reference resistance;

a first node coupled to a first voltage through the reference resistance;

a plurality of second nodes coupled to a second voltage through the measurement resistances;

a plurality of selector switches for selecting the second node to be coupled to the first node;

a correction circuit that generates a voltage obtained by subtracting a voltage between the second node selected by the selector switches and the first node from the first voltage as a correction voltage;

a double integral analog-digital conversion circuit that finds a first integral time elapsed when a difference voltage of the correction voltage with respect to the voltage of the second nodes is integrated to the second voltage and a second integral time elapsed when a difference voltage of the second voltage with respect to the voltage of the second nodes is integrated to the correction voltage; and a control part that inputs therein the first integral time and the second integral time, calculates a value obtained by multiplexing a ratio of the first integral time to the second integral time by a resistance value of the reference voltage, and controls the control object apparatus based on the calculation result.

* * * * *